(12) United States Patent
Xie et al.

(10) Patent No.: US 9,543,426 B2
(45) Date of Patent: Jan. 10, 2017

(54) SEMICONDUCTOR DEVICES WITH SELF-ALIGNED CONTACTS AND LOW-K SPACERS

(71) Applicant: GLOBALFOUNDRIES Inc., Grand Cayman (KY)

(72) Inventors: Ruilong Xie, Albany, NY (US); Xiuyu Cai, Albany, NY (US); Kangguo Cheng, Schenectady, NY (US); Ali Khakifirooz, Mountain View, CA (US)

(73) Assignees: GLOBALFOUNDRIES Inc., Grand Cayman (KY); International Business Machines Corporation, Armonk, NY (US)

(*) Notice: Subject to any disclaimer, the term of this patent is extended or adjusted under 35 U.S.C. 154(b) by 10 days.

(21) Appl. No.: 13/957,587

(22) Filed: Aug. 2, 2013

(65) Prior Publication Data
US 2014/0042502 A1 Feb. 13, 2014

Related U.S. Application Data

(62) Division of application No. 13/584,055, filed on Aug. 13, 2012, now Pat. No. 8,524,592.

(51) Int. Cl.
H01L 29/78 (2006.01)
H01L 29/66 (2006.01)
H01L 21/768 (2006.01)

(52) U.S. Cl.
CPC .......... H01L 29/78 (2013.01); H01L 29/6656 (2013.01); H01L 29/66545 (2013.01); H01L 29/66628 (2013.01); H01L 29/66636 (2013.01); H01L 21/76897 (2013.01)

(58) Field of Classification Search
CPC ............. H01L 29/518; H01L 29/6656; H01L 29/66621; H01L 21/823864; H01L 29/78; H01L 29/42376; H01L 21/28114
USPC ........................................................ 257/387
See application file for complete search history.

(56) References Cited

U.S. PATENT DOCUMENTS

| 2005/0090066 | A1 | 4/2005 | Zhu et al. | |
| 2008/0029834 | A1* | 2/2008 | Sell | H01L 29/4983 257/411 |
| 2008/0299733 | A1* | 12/2008 | Press | H01L 21/31116 438/299 |
| 2009/0001480 | A1* | 1/2009 | Cheng | 257/387 |
| 2009/0179283 | A1* | 7/2009 | Adams et al. | 257/411 |

(Continued)

Primary Examiner — Thao X Le
Assistant Examiner — Geoffrey Ida
(74) Attorney, Agent, or Firm — Amerson Law Firm, PLLC

(57) ABSTRACT

One illustrative method disclosed herein includes removing a portion of a sacrificial sidewall spacer to thereby expose at least a portion of the sidewalls of a sacrificial gate electrode and forming a liner layer on the exposed sidewalls of the sacrificial gate electrode. In this example, the method also includes forming a sacrificial gap fill material above the liner layer, exposing and removing the sacrificial gate electrode to thereby define a gate cavity that is laterally defined by the liner layer, forming a replacement gate structure, removing the sacrificial gap fill material and forming a low-k sidewall spacer adjacent the liner layer. A device is also disclosed that includes a gate cap layer, a layer of silicon nitride or silicon oxynitride positioned on each of two upstanding portions of a gate insulation layer and a low-k sidewall spacer positioned on the layer of silicon nitride or silicon oxynitride.

21 Claims, 12 Drawing Sheets

(56) References Cited

U.S. PATENT DOCUMENTS

2011/0108930 A1* 5/2011 Cheng et al. ................ 257/412

* cited by examiner

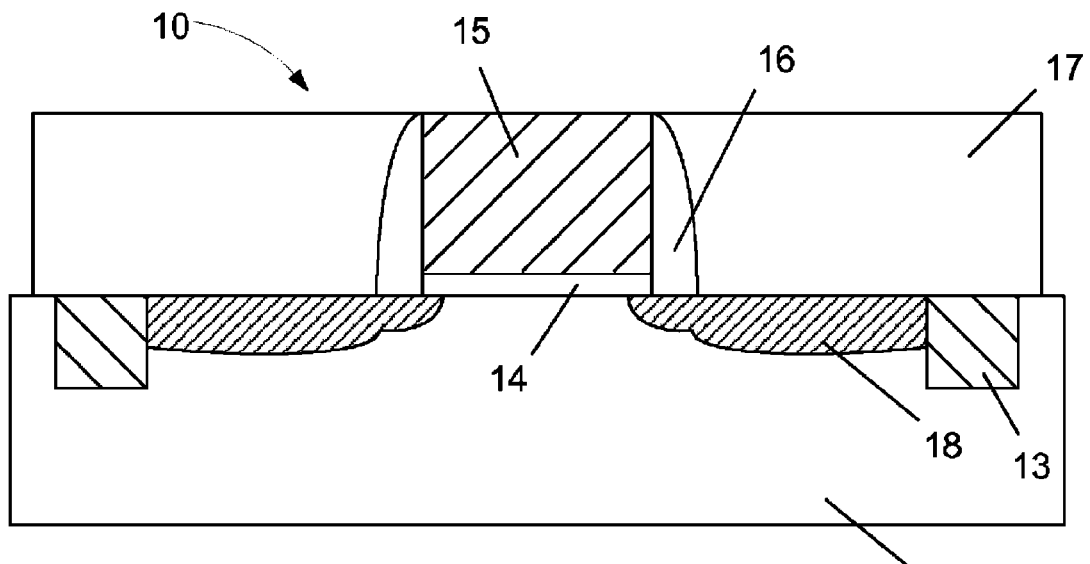
(Prior Art) Figure 1A
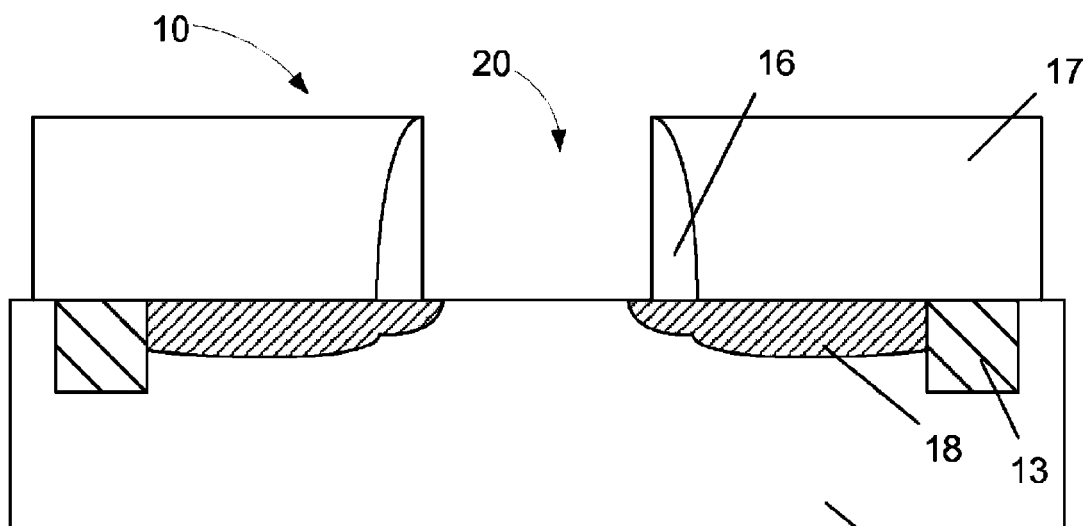
(Prior Art) Figure 1B

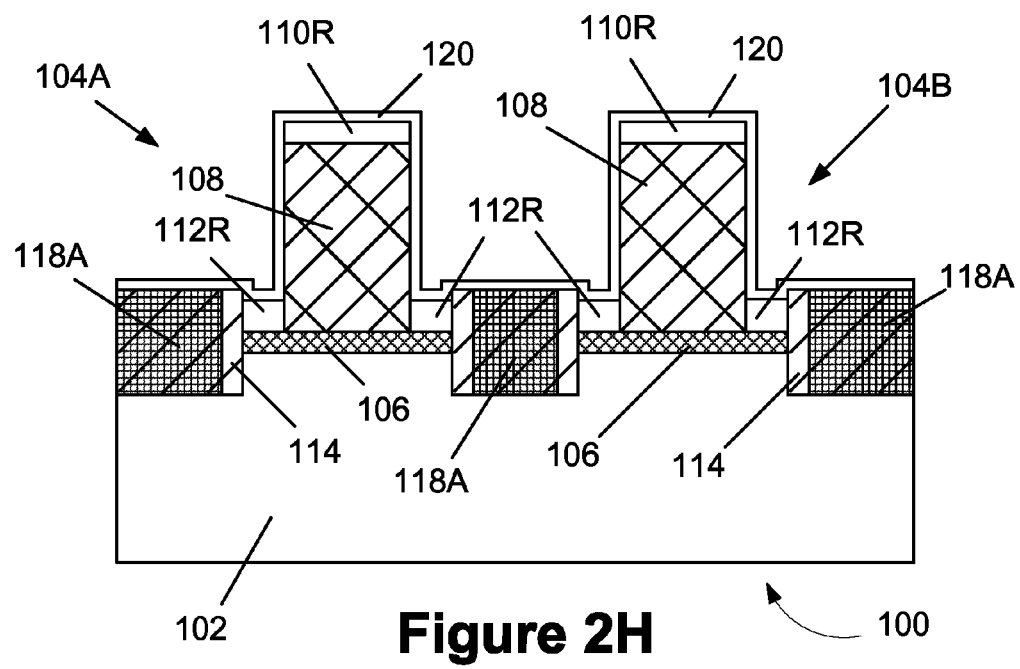
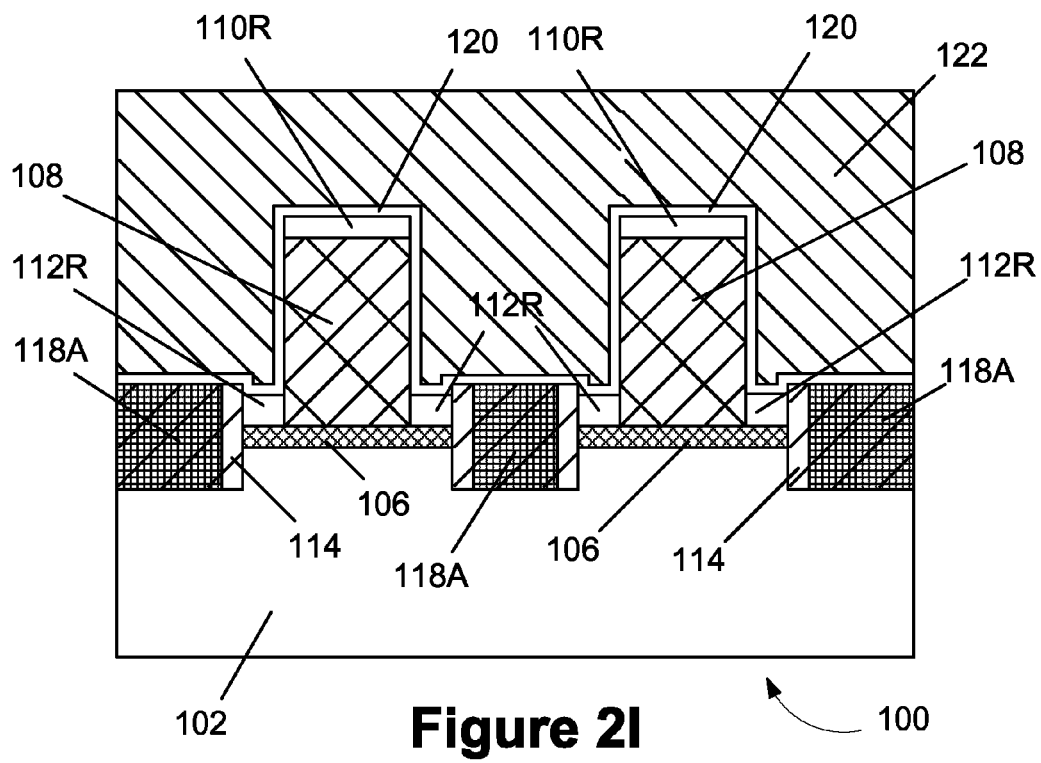

SEMICONDUCTOR DEVICES WITH SELF-ALIGNED CONTACTS AND LOW-K SPACERS

CROSS-REFERENCE TO RELATED APPLICATION

This is a divisional of co-pending application Ser. No. 13/584,055, filed Aug. 13, 2012.

BACKGROUND OF THE INVENTION

1. Field of the Invention

Generally, the present disclosure relates to the manufacture of sophisticated semiconductor devices, and, more specifically, to various methods of forming semiconductor devices with self-aligned contacts and low-k spacers and various semiconductor devices having such features.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NFET and PFET transistors) represent one important type of circuit element that substantially determines performance of such integrated circuits. During the fabrication of complex integrated circuits using, for instance, MOS technology, millions of transistors, e.g., NFET transistors and/or PFET transistors, are formed on a substrate including a crystalline semiconductor layer. A field effect transistor, whether an NFET or a PFET device, is a planar device that typically includes a source region, a drain region, a channel region that is positioned between the source region and the drain region, a gate insulation layer and a gate electrode positioned above the gate insulation layer over the channel region. By applying an appropriate voltage to the gate electrode, the channel region becomes conductive and current is allowed to flow from the source region to the drain region.

For many early device technology generations, the gate structures of most transistor elements have been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-20 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. FIGS. 1A-1D depict one illustrative prior art method for forming an HK/MG replacement gate structure using a replacement gate technique. As shown in FIG. 1A, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NFET devices and P-type dopants for PFET devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PFET transistors. At the point of fabrication depicted in FIG. 1A, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1B, one or more etching processes are performed to remove the sacrificial gate electrode 15 and the sacrificial gate insulation layer 14 to thereby define a gate cavity 20 where a replacement gate structure will subsequently be formed. A masking layer that is typically used in such etching processes is not depicted for purposes of clarity. Typically, the sacrificial gate insulation layer 14 is removed as part of the replacement gate technique, as depicted herein. However, the sacrificial gate insulation layer 14 may not be removed in all applications.

Next, as shown in FIG. 1C, various layers of material that will constitute a replacement gate structure 30 are formed in the gate cavity 20. The materials used for such replacement gate structures 30 may vary depending upon the particular application. Even in cases where the sacrificial gate insulation layer 14 is intentionally removed, there will typically be a very thin native oxide layer (not shown) that forms on the substrate 12 within the gate cavity 20. In one illustrative example, the replacement gate structure 30 is comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C (e.g., a layer of tantalum nitride with a thickness of about 1-2 nm), a third metal layer 30D (e.g., a layer of titanium nitride with a thickness of about 5 nm) and a bulk metal layer 30E, such as aluminum. Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30.

As device dimensions have decreased and packing densities have increased, parasitic capacitance is becoming more important as a factor to consider to improve the operating speed of transistor devices. Typically, as noted above, the gate structure of a transistor will include at least one sidewall spacer positioned adjacent the gate structure. Typically, the sidewall spacers are made of silicon nitride and they are normally formed very soon after the sacrificial gate structure is formed for devices manufactured using the replacement gate technique. For replacement gate structures, two of the primary purposes of the silicon nitride spacers are to define the gate cavity in the replacement gate manufacturing process and to protect the final replacement gate structure.

FIG. 1E depicts an illustrative prior art semiconductor device 10A comprised of first and second transistors 40A, 40B formed in and above the substrate 12. Each of the transistors 40A, 40B is comprised of a schematically depicted replacement gate structure 42 (which includes the gate insulation layer and gate electrode), a gate cap layer 44 and sidewall spacers 46. Also depicted are illustrative raised source/drain regions 48 and a plurality of self-aligned contacts 50 that are positioned in a layer of insulating material 48, e.g., silicon dioxide. The self-aligned contacts 50 are conductively coupled to the raised source/drain regions 48. The spacers 46 are typically made of silicon nitride which has a relatively high k value of, e.g., about 7-8. As a result of the structure of the transistors, a gate-to-contact capacitor is generally defined in the regions 55, where the gate electrode of the replacement gate structure functions as one of the conductive plates of the capacitor and the self-aligned contact 50 functions as the other conductive plate of the capacitor. The presence of the silicon nitride spacer material (with a relatively high k value) tends to increase the parasitic capacitance between the conductive gate electrode and self-aligned contacts. This problem has become even more problematic as packing densities have increased, which causes the gate structures of adjacent transistors to be positioned ever closer to one another. Unfortunately, the gate-to-contact capacitor tends to slow down the switching speed of the transistor as this capacitor must be charged and discharged each time the transistor is turned on-off.

The use of alternative materials for the sidewall spacers, such as materials having k values less than about 6 or so, has been problematic. Most of such low-k materials are based upon carbon or boron doped silicon nitride. The low-k material, when used as a traditional spacer material, is subjected to a reactive ion etching (RIE) process to define the spacer from such a low-k material. The RIE process tends to deplete the carbon and boron, thereby effectively increasing the k value of the low-k material. Such low-k materials also tend to be weaker mechanically than silicon nitride, which makes them less capable of standing up to the rigors of processing after they are formed. Moreover, such spacers are typically subjected to relatively high temperature source/drain anneal processes, which also tends to deplete the carbon and boron from such low-k materials.

The present disclosure is directed to various methods of forming semiconductor devices with self-aligned contacts and low-k spacers and various semiconductor devices incorporating such low-k spacers that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices with self-aligned contacts and low-k spacers and various semiconductor devices having such features. One illustrative method disclosed herein includes forming a sacrificial gate structure above a semiconducting substrate that comprises a sacrificial gate electrode, forming at least one sacrificial sidewall spacer adjacent the sacrificial gate electrode, performing at least one etching process to remove at least a portion of the sacrificial sidewall spacer and thereby expose at least a portion of the sidewalls of the sacrificial gate electrode and, after performing the etching process, forming a liner layer on the exposed sidewalls of the sacrificial gate electrode. In this example, the method includes the additional steps of forming at least one layer of sacrificial gap fill material above the liner layer, performing at least one process operation to expose an upper surface of the sacrificial gate electrode, after exposing the upper surface of the sacrificial gate electrode, removing at least the sacrificial gate electrode to thereby define a gate cavity that is laterally defined by the liner layer, forming a replacement gate structure in the gate cavity, after forming the replacement gate structure, removing the at least one layer of sacrificial gap fill material and forming a low-k sidewall spacer adjacent the liner layer.

One example of a novel device disclosed herein includes a gate structure positioned above a semiconducting substrate, wherein the gate structure includes a gate insulation layer and a gate electrode, and wherein the gate insulation layer has two upstanding portions that are substantially vertically oriented relative to an upper surface of the substrate, a gate cap layer positioned above the gate insulation layer and the gate electrode, a layer of silicon nitride or silicon oxynitride positioned on each of the two upstanding portions of the gate insulation layer and a low-k sidewall spacer positioned on the layer of silicon nitride or silicon oxynitride.

BRIEF DESCRIPTION OF THE DRAWINGS

The disclosure may be understood by reference to the following description taken in conjunction with the accompanying drawings, in which like reference numerals identify like elements, and in which:

FIGS. 1A-1E depict a semiconductor device with self-aligned contacts where the gate structures of the transistors were formed using a so-called "replacement gate" technique.

Figure 1C:
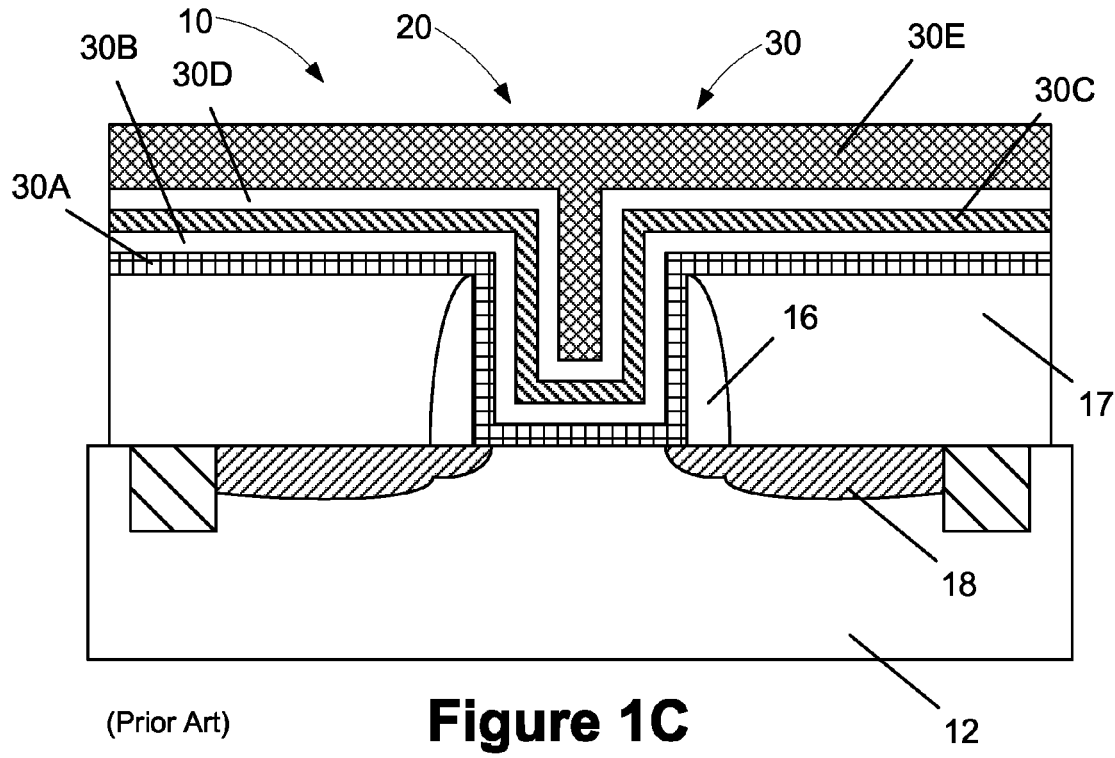
Figure 1D:
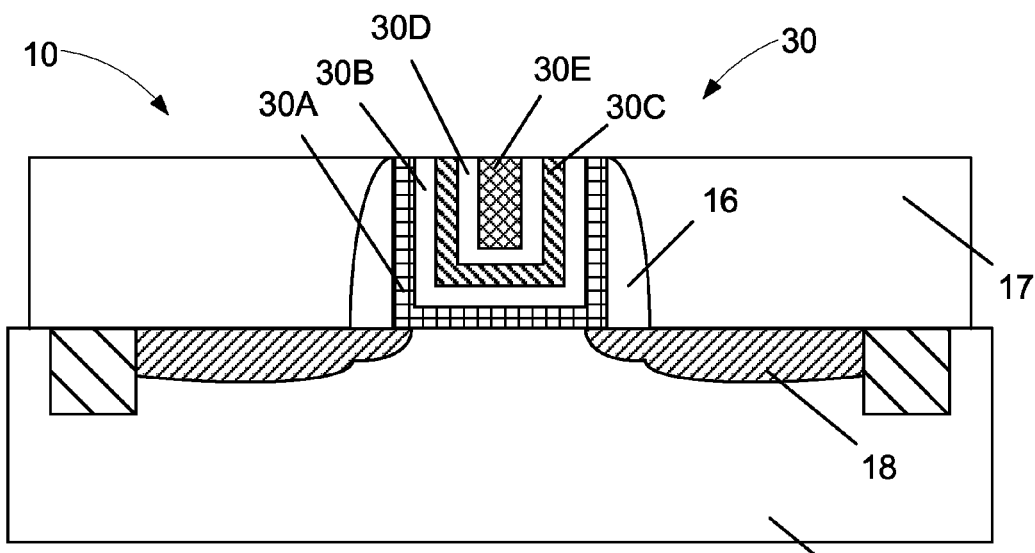

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming semiconductor devices with self-aligned contacts and low-k spacers and various semiconductor devices having such features. As will be readily apparent to those skilled in the art upon a complete reading of the present application, the methods disclosed herein may be employed with a variety of different technologies, e.g., NMOS, PMOS, CMOS, etc., and in manufacturing a variety of different devices, including, but not limited to, logic devices, memory devices, etc. With reference to the attached figures, various illustrative embodiments of the methods and devices disclosed herein will now be described in more detail.

In general, the present disclosure is directed to various methods of forming semiconductor devices with self-aligned contacts and low-k spacers and various semiconductor devices incorporating such self-aligned contacts and low-k spacers. As will be appreciated by those skilled in the art after a complete reading of the present application, the inventions disclosed herein may be employed in forming planar transistor devices (NFET or PFET devices), as well as so-called 3-D devices, such as FinFETs. For purposes of disclosure, reference will be made to an illustrative process flow for forming a planar transistor device. However, the inventions disclosed herein should not be considered to be limited to such an illustrative example.

Figure 2A:
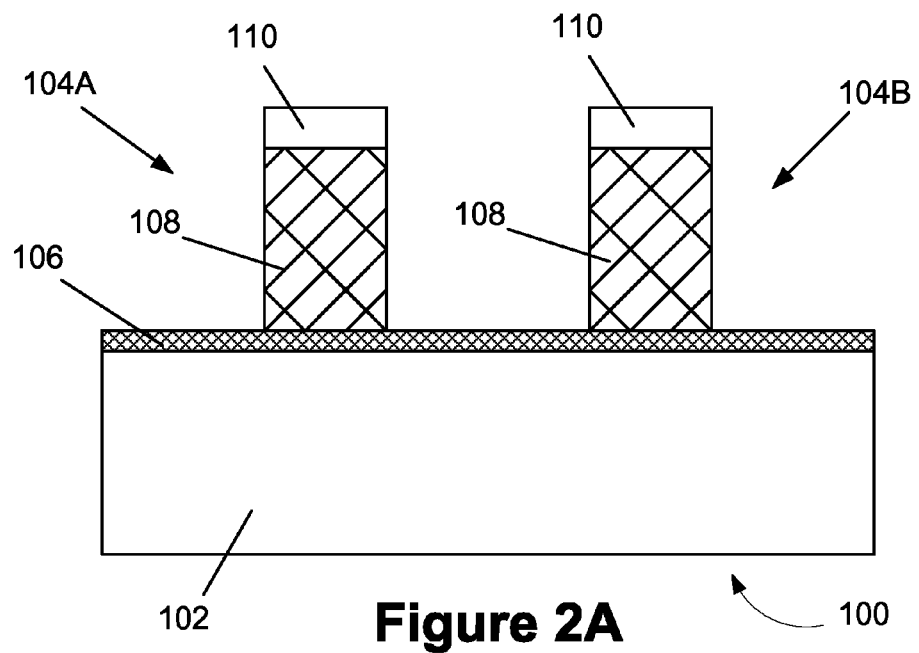
FIGS. 2A-2R depict one illustrative method disclosed herein for forming semiconductor devices with self-aligned contacts and low-k spacers and one example of a device having such features.

FIG. 2A is a simplified view of an illustrative semiconductor device 100 at an early stage of manufacturing. Illustrative transistors 104A, 104B will be formed in and above the semiconducting substrate 102. So as not to obscure the inventions disclosed herein, isolation regions that are formed in the substrate to define active regions where the transistors 104A, 104B will be formed are not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconducting substrate" should be understood to cover all semiconducting materials and all forms of such materials.

In the example disclosed herein, the transistors 104A, 104B will be formed using a replacement gate technique. Accordingly, with continuing reference to FIG. 2A, the process begins with the formation of a sacrificial gate insulation layer 106 and schematically depicted sacrificial gate electrodes 108 with a cap layer 110 formed thereabove. Such structures and layers may be formed using a variety of different materials and by performing a variety of known techniques. For example, the sacrificial gate insulation layer 106 may be comprised of silicon dioxide, the sacrificial gate electrode layer 108 may be comprised of polysilicon or amorphous silicon and the cap layer 110 may be comprised of silicon nitride. The sacrificial gate insulation layer 106, sacrificial gate electrode layer 108 and the cap layer 110 may be of any desired thickness or configuration. Moreover, the mask layer 110 could be comprised of multiple layers of material, such as, for example, a combination of a silicon nitride layer and a layer of silicon dioxide. Thus, the particular form and composition of the mask layer 110 and the manner in which it is made should not be considered a limitation of the present invention. Of course, those skilled in the art will recognize that there are other features of the transistors 104A, 104B that are not depicted in the drawings so as not to obscure the present invention. For example, so-called halo implant regions and various layers or regions of silicon/germanium that are typically found in high performance PFET transistors are not depicted in the drawings. The layers of material depicted in FIG. 2A may be formed by any of a variety of different known techniques, e.g., a chemical vapor deposition (CVD) process, an atomic layer deposition (ALD) process, a thermal growth process, etc. One or more patterning and etching processes are performed to define the sacrificial gate electrode 108 and the gate cap layer 110. Typically, the cap layer 110 is patterned using known photolithography and etching techniques to thereby define a patterned cap layer. Alternatively, the cap layer 110 may be patterned using known sidewall image transfer techniques. Thereafter one or more etching processes are performed through the patterned cap layer 110 to remove exposed portions of the sacrificial gate electrode material layer to thereby define the depicted sacrificial gate electrodes 108.

Figure 2B:
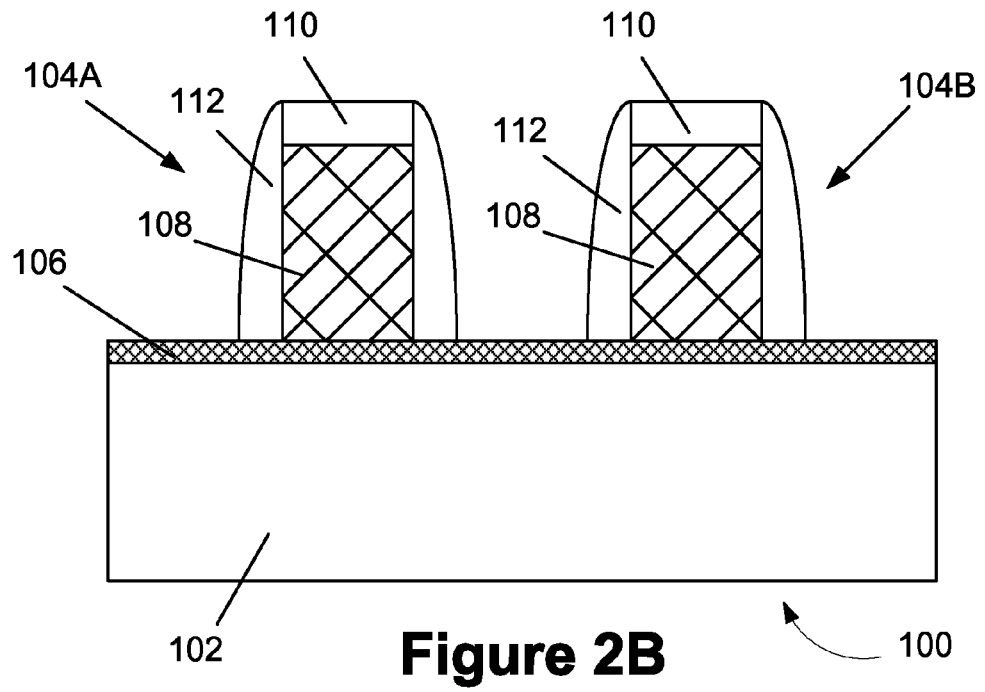

FIG. 2B depicts the device 100 after a first sacrificial sidewall spacer 112 was formed adjacent the sacrificial gate electrode 108. The first sacrificial sidewall spacer 112 may be formed by depositing a layer of spacer material and thereafter performing an anisotropic etching process. The first sacrificial sidewall spacer 112 may be comprised of a variety of different materials, e.g., silicon nitride, silicon oxynitride, etc. The base thickness of the first sacrificial sidewall spacer 112 may vary depending upon the particular application. In one illustrative embodiment, the first sacrificial sidewall spacer 112 may have a thickness at its base of about 7-15 nm.

Figure 2C:
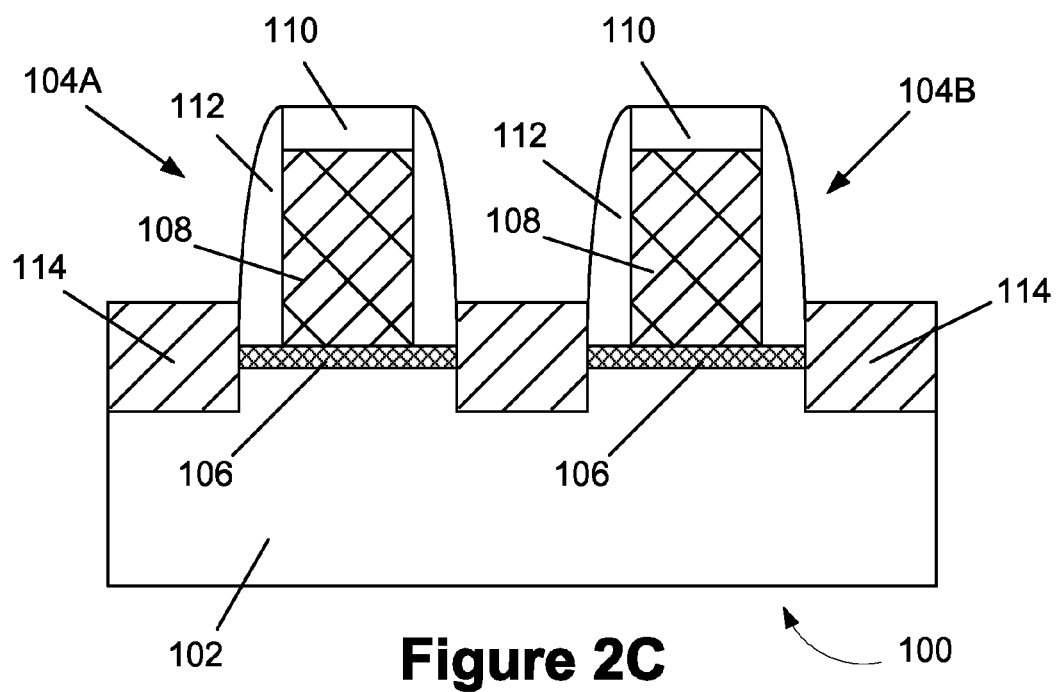

Next, as shown in FIG. 2C, various known process operations are performed to form illustrative raised source/drain regions 114 in the substrate 102 adjacent the first sacrificial sidewall spacers 112. However, such raised source/drain regions 114 need not be formed in all applications, and the disclosed inventions should not be considered to be limited to such an illustrative configuration. The raised source/drain region 114 may be formed by forming cavities in the substrate 102 and thereafter performing an epitaxial deposition process to thereby form doped semiconductor material in the cavities in the substrate 102. Although not depicted in the drawings, an extension implantation process may be performed to form extension implant regions (not shown) in the substrate 102 prior to or after the formation of the first sacrificial sidewall spacer 112.

Figure 2D:
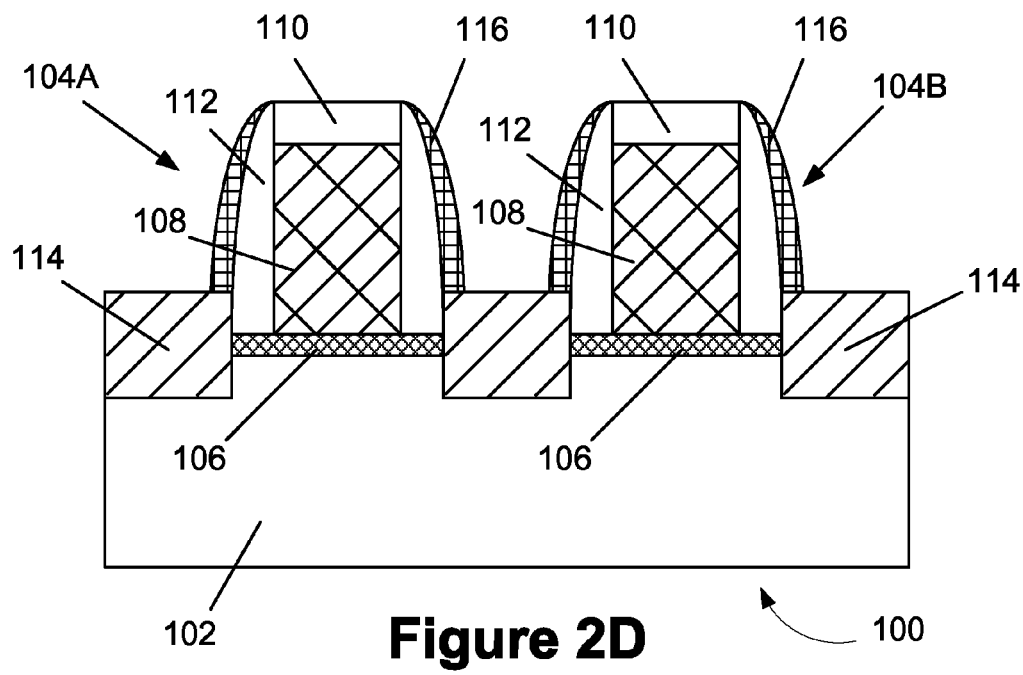

Next, as shown in FIG. 2D, a second sacrificial sidewall spacer 116 is formed adjacent the first sacrificial sidewall spacer 112. The second sacrificial sidewall spacer 116 may be formed by depositing a layer of spacer material and thereafter performing an anisotropic etching process. The second sacrificial sidewall spacer 116 may be comprised of a variety of different materials such as, for example, silicon dioxide. The base thickness of the second sacrificial sidewall spacer 116 may vary depending upon the particular application. In one illustrative embodiment, the second sacrificial sidewall spacer 116 may have a thickness at its base of about 3-10 nm.

Figure 2E:
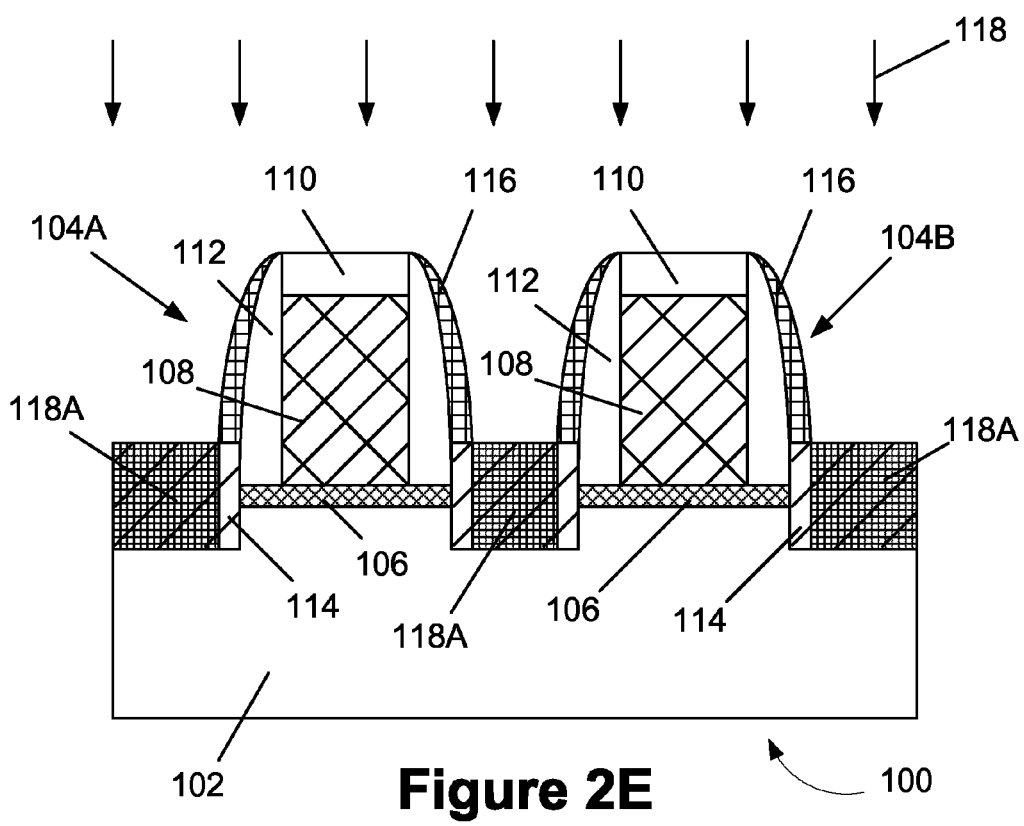

Then, as shown in FIG. 2E, in one illustrative process flow, a heavy, source/drain ion implantation process 118 is performed to form doped regions 118A in the raised source/drain regions 114. The doped regions 118A may be comprised of implanted dopant materials (N-type dopants for NFET devices and P-type dopants for PFET devices) that are implanted using known masking and ion implantation techniques. As will be recognized by those skilled in the art after a complete reading of the present application, the second sacrificial sidewall spacer 116 is optional in nature and may not be formed in manufacturing all possible versions of the semiconductor devices disclosed herein. For example, where the raised source/drain regions 114 are doped in situ, the second sacrificial spacers 116 may or may not be formed.

Figure 2F:
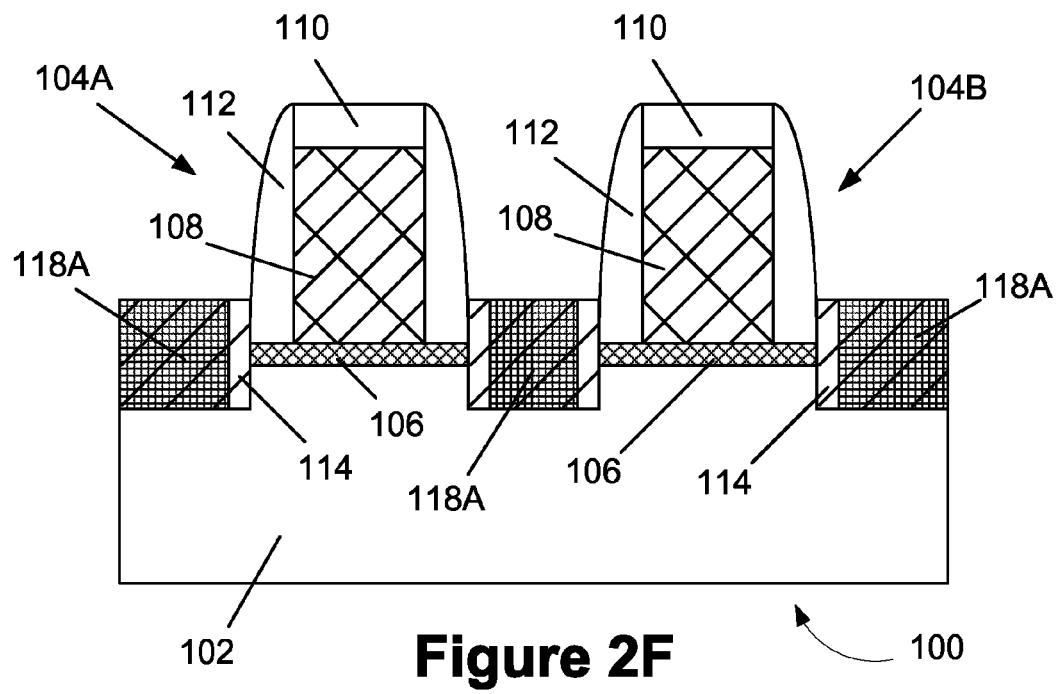

Next, as shown in FIG. 2F, the second sacrificial sidewall spacer 116 is removed by performing a wet or dry etching process that selectively removes the second sacrificial sidewall spacer 116 relative to surrounding structures.

Figure 2G:
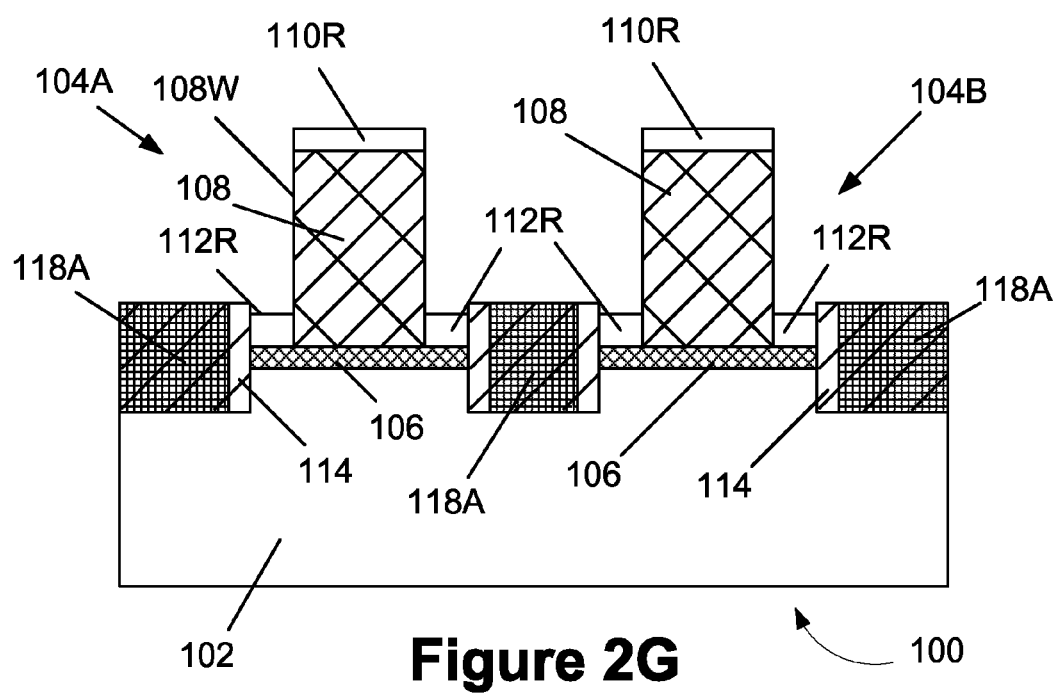

FIG. 2G depicts the device 100 after an etching process has been performed to remove portions of the first sacrificial sidewall spacer 112. This etching process exposes the sidewalls 108W of the sacrificial gate electrode 108. In one illustrative embodiment, the etching process is a timed, wet, isotropic etching process. After the etching process is performed, in one embodiment, a residual portion 112R of the first sacrificial sidewall spacer 112 remains in place as depicted. The residual portion 112R will serve to protect the underlying portions of the junction between the source/drain regions 114 and the substrate 102 and limit the formation of metal silicide material on the raised source/drain regions 114, as described more fully below. The etching process also tends to reduce the thickness of the gate cap layer, as reflected by the new numerical reference 110R for the reduced thickness gate cap layer.

Next, as shown in FIG. 2H, a conformably deposited liner layer of insulating material 120 having a thickness of about 2-5 nm is formed on the device 100. In one illustrative embodiment, the liner layer 120 is deposited on the exposed sidewalls 108W of the sacrificial gate electrode 108. The layer of insulating material 120 may be comprised of a variety of different materials, e.g., silicon nitride, silicon oxynitride, etc., and it may be formed by performing an ALD or CVD process.

Then, as shown in FIG. 2I, a layer of sacrificial gap fill material 122 is blanket-deposited over the device 100. In one illustrative example, the layer of sacrificial gap fill material 122 may be a silicon dioxide material, such as a flowable oxide material, and it may be formed using traditional techniques, e.g., CVD, spin-on/cure, etc. In another illustrative example, the sacrificial gap material 122 may be an amorphous silicon material formed using traditional techniques, e.g. CVD.

Figure 2J:
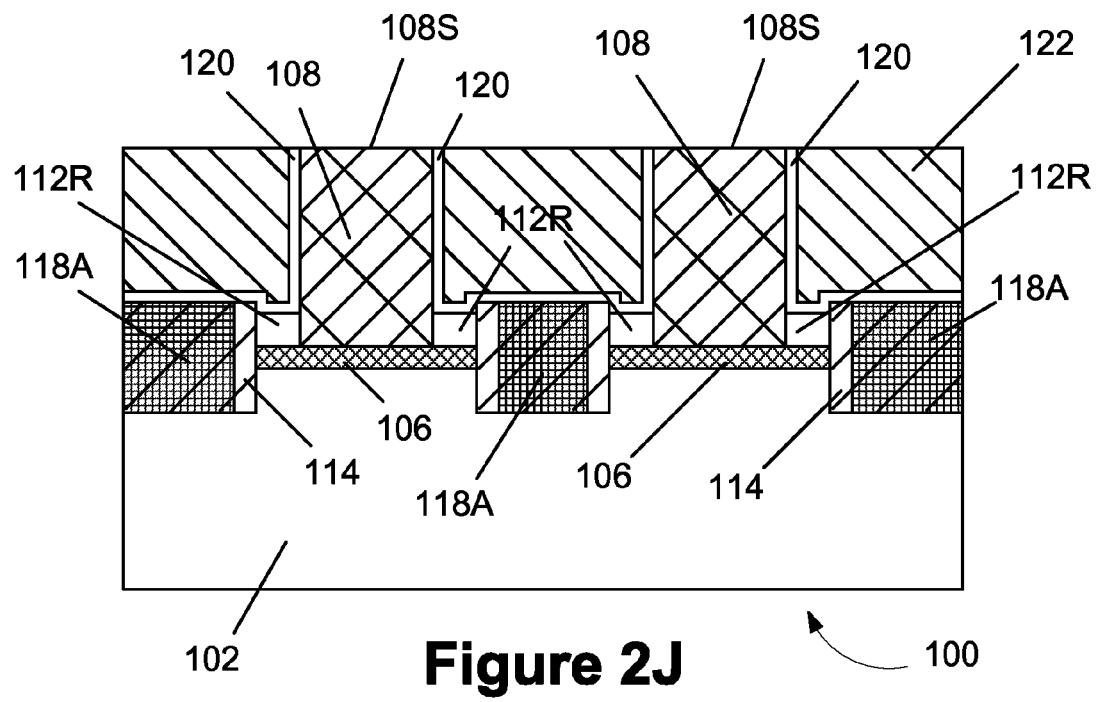

FIG. 2J depicts the device 100 after one or more CMP processes have been performed on the insulating layer 122. The CMP process stops on the upper surface 108S of the sacrificial gate electrode 108, i.e., the sacrificial gate electrode 108 is used as a polish stop. In this example, the CMP process removes portions of the conformably deposited layer of insulating material 120 and the reduced thickness gate cap layer 110. Note that if the gap fill material 122 is amorphous silicon, the CMP process could stop on the silicon nitride liner layer 120 first, followed by recessing the amorphous silicon layer 122 below the top surface 108S of the sacrificial gate electrode 108. Thereafter, if desired, an oxide gap fill material may be deposited above the recessed amorphous silicon layer, followed by performing a CMP process that stops on the upper surface 108S of the sacrificial gate electrode 108. In such an example, the sacrificial gap fill material has a bi-layer construction: a layer of amorphous silicon on bottom and a layer of silicon dioxide on top of the layer of amorphous silicon. Importantly, these CMP processes expose the upper surface 108S of the sacrificial gate electrode 108 for further processing.

Figure 2K:
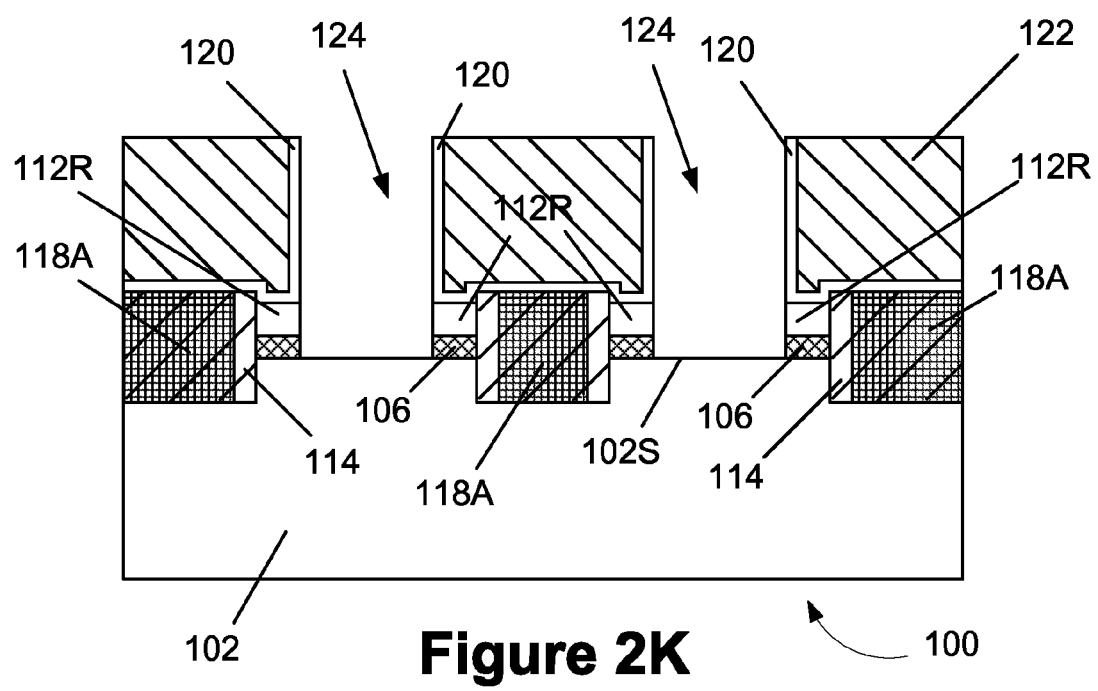
Figure 2L:
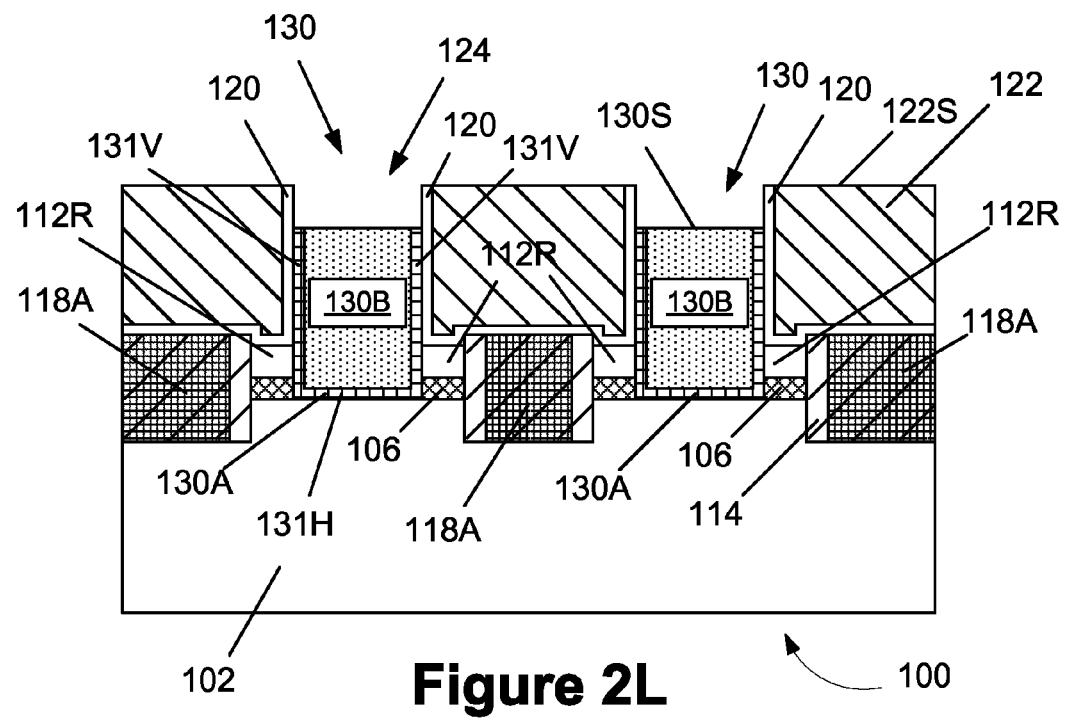

FIGS. 2K and 2L depict several process operations that are directed to the removal of the sacrificial gate electrode 108 and the sacrificial gate insulation layer 106, and the formation of a replacement gate structure 130 for the transistors 104A, 104B. As shown in FIG. 2K, one or more etching processes are performed to remove the sacrificial gate electrode 108 and portions of the sacrificial gate insulation layer 106 exposed by the removal of the sacrificial gate electrode 108 to thereby define a gate cavity 124 where the replacement gate structure 130 will subsequently be formed. Note that the gate cavity 124 is laterally defined by the conformably deposited layer of insulating material 120 at this point in the process flow. A masking layer (not shown) that is typically used in such an etching process is not depicted for purposes of clarity. Typically, the sacrificial gate insulation layer 106 is removed as part of the replacement gate technique, as depicted herein. However, the sacrificial gate insulation layer 106 may not be removed in all applications. Even in cases where the sacrificial gate insulation layer 106 is intentionally removed, there will typically be a very thin native oxide layer (not shown) that forms on the substrate 102 within the gate cavity 124.

As shown in FIG. 2L, schematically depicted replacement gate structures 130 for the transistors 104A, 104B are formed in the gate cavities 124. The schematically depicted gate structure 130 includes an illustrative gate insulation layer 130A and an illustrative gate electrode 130B. As will be recognized by those skilled in the art after a complete reading of the present application, the gate structure 130 of the device 100 depicted in the drawings, i.e., the gate insulation layer 130A and the gate electrode 130B, is intended to be representative in nature. For example, the gate insulation layer 130A may be comprised of a variety of different materials, such as, for example, silicon dioxide, a so-called high-k (k greater than 10) insulation material (where k is the relative dielectric constant), etc. The gate electrode 130B may be comprised of one or more layers of conductive material, e.g., polysilicon, tungsten, aluminum, one or more layers of metal, etc. As noted above, in some cases, if desired, a metal layer (not shown), such as a very thin work function adjusting metal (e.g., a layer of titanium nitride), may be formed on the high-k gate insulation layer 130A. As will be recognized by those skilled in the art after a complete reading of the present application, the insulating materials and the metal layer(s) that are part of the replacement gate structure 130 may be of any desired construction and comprised of any of a variety of different materials. Additionally, the replacement gate structure 130 for an NFET device may have different material combinations as compared to a replacement gate structure 130 for a PFET device. Thus, the particular details of construction of replacement gate structure 130, and the manner in which such a replacement gate electrode structure 130 is formed, should not be considered a limitation of the present invention unless such limitations are expressly recited in the attached claims.

In one illustrative example, the replacement gate formation process begins with performing a conformal deposition process to form the high-k gate insulation layer 130A in the gate cavities 124 and above the layer of sacrificial gap fill material 122 followed by performing a high temperature anneal process in an attempt to anneal out or repair any defects in the high-k gate insulation layer 130A. Thereafter, the conductive materials that will be used for the gate electrode 130B, e.g., one or more metal layers, will be deposited across the devices by performing one or more conformal deposition processes and/or one or more blanket-deposition processes so as to substantially overfill the gate cavities 124 with conductive gate electrode material(s). At that point, one or more CMP processes are performed to remove excess portions of the gate insulation layer 130A and the layers of conductive material that will be used to form the gate electrode 130B positioned above the layer of sacrificial gap fill material 122. This CMP process essentially planarizes the upper surface of the materials of the gate structure 130 with the upper surface 122S of the layer of sacrificial gap fill material 122. Thereafter, an etching process is performed to reduce the height of the replacement gate structure 130 such that the upper surface 130S of the replacement gate electrode 130B is positioned below the upper surface 122S of the layer of sacrificial gap fill material 122. These process operations result in the structure depicted in FIG. 2L. Note that, in the depicted example, the gate insulation layer has a generally "U" shaped configuration with a substantially horizontal portion 131H (that contacts the substrate 102) and two upstanding vertically oriented (relative to the surface of the substrate) portions 131V.

Figure 2M:
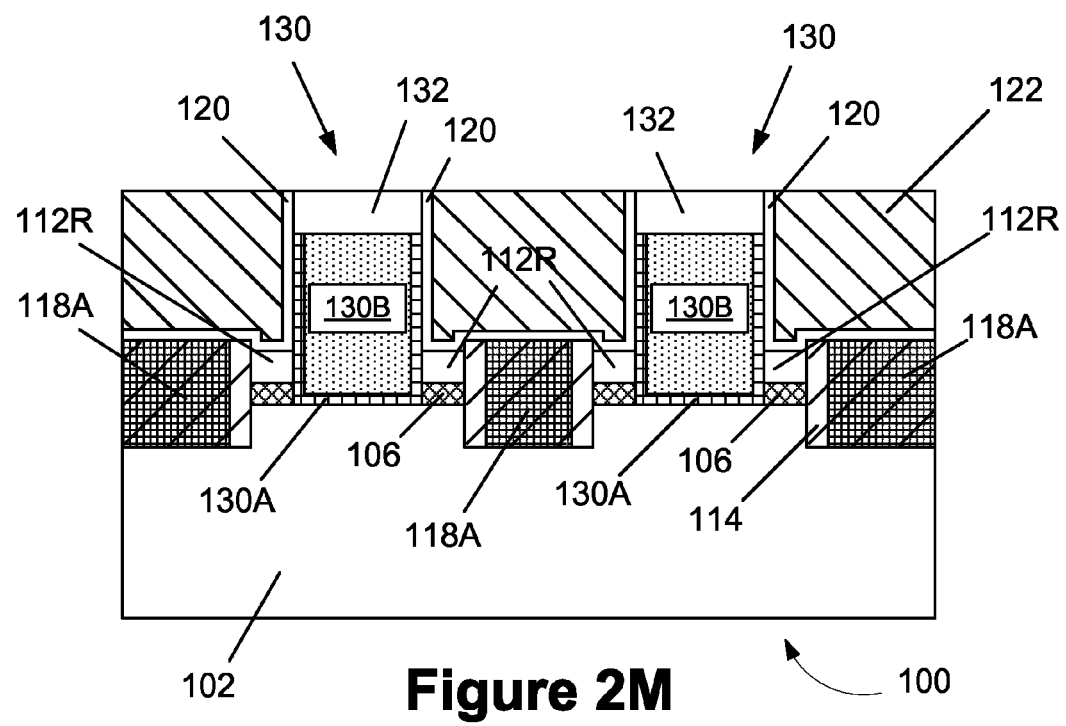

Next, as shown in FIG. 2M, an illustrative gate cap layer 132, comprised of, for example, silicon nitride, has been formed above the recessed gate structure 130. The gate cap layer 132 may be formed by depositing a layer of the cap material and thereafter performing a CMP process to remove excess portions of the cap material positioned on top of the layer of sacrificial gap fill material 122.

Figure 2N:
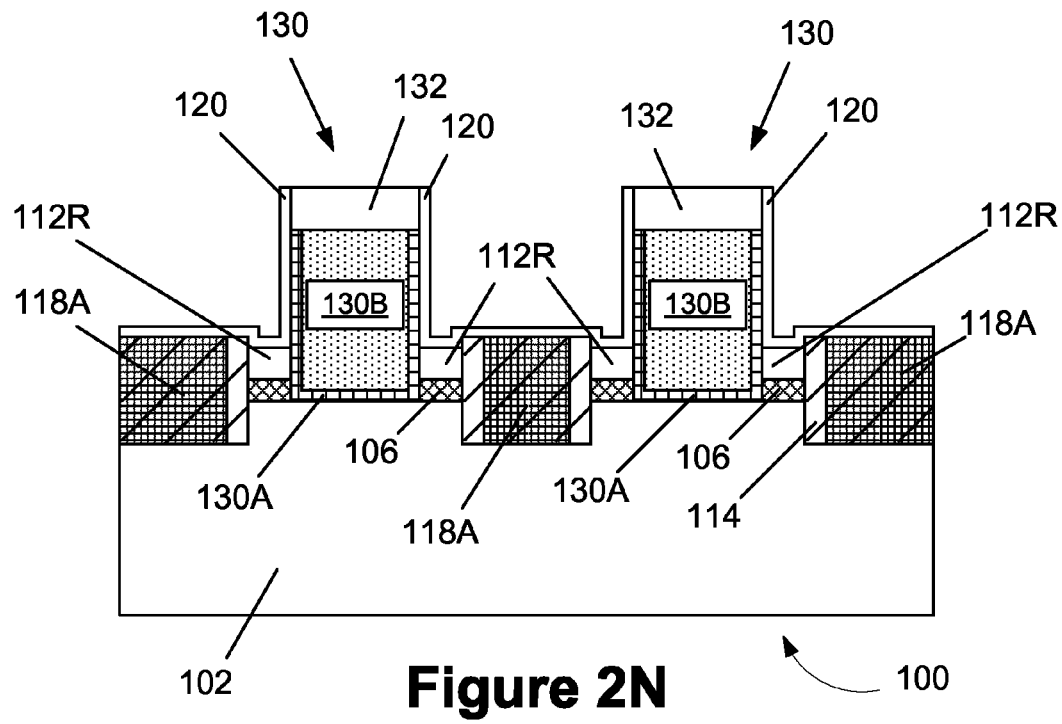

Next, as shown in FIG. 2N, the layer of sacrificial gap fill material 122 is removed by performing a wet or dry etching process that selectively removes the layer of sacrificial gap fill material 122 relative to surrounding structures. In the case where the sacrificial gap fill material 122 is a single layer of silicon dioxide, it may be removed using traditional techniques, e.g., a DHF or a BHF process. In the case where the sacrificial gap fill material 122 is an oxide/amorphous silicon bi-layer, the bi-layer sacrificial gap fill material could be removed by performing a short BHF wet etch of the silicon dioxide material, followed by performing a hot ammonia based wet etch to remove the amorphous silicon layer.

Figure 2O:
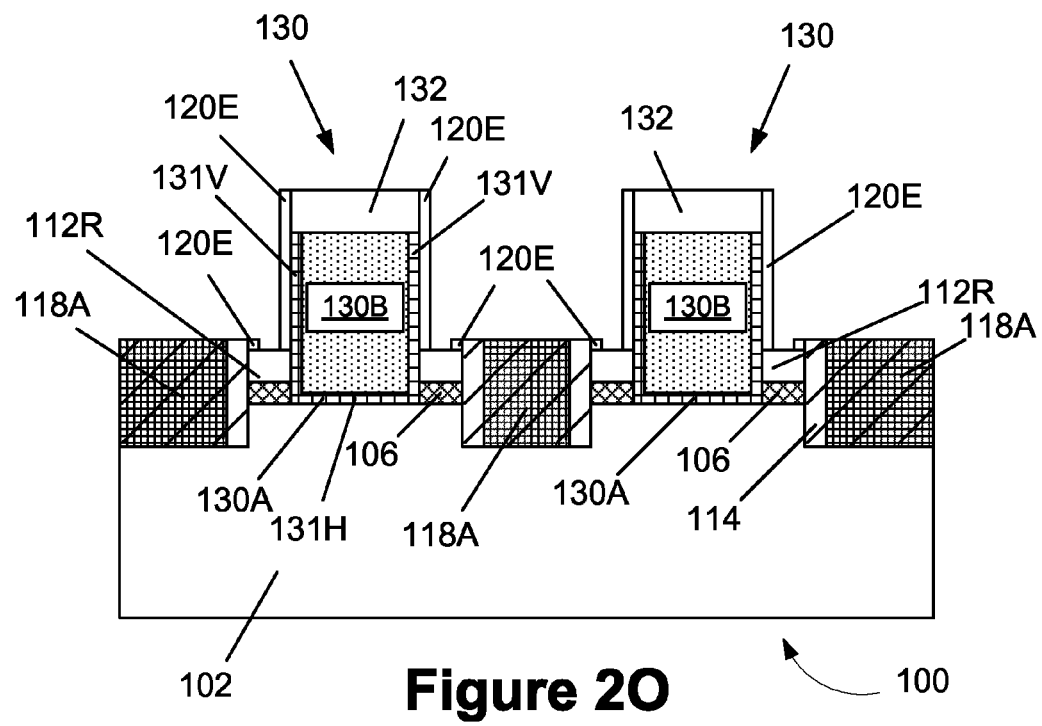

Thereafter, as shown in FIG. 2O, an etching process is performed to essentially remove horizontally-oriented portions of the liner layer of insulating material 120 to produce an etched liner layer of insulating material 120E. In one illustrative embodiment, this etching process may be a dry, anisotropic etching process. Note that, in the depicted example, the gate insulation layer 130A has a generally "U" shaped configuration with a substantially horizontal portion 131H (that contacts the substrate 102) and two upstanding vertically oriented (relative to the surface of the substrate) portions 131V. In the depicted example, the etched liner layer 120E engages the vertically oriented portions 131V of the gate insulation layer 130A.

Figure 2P:
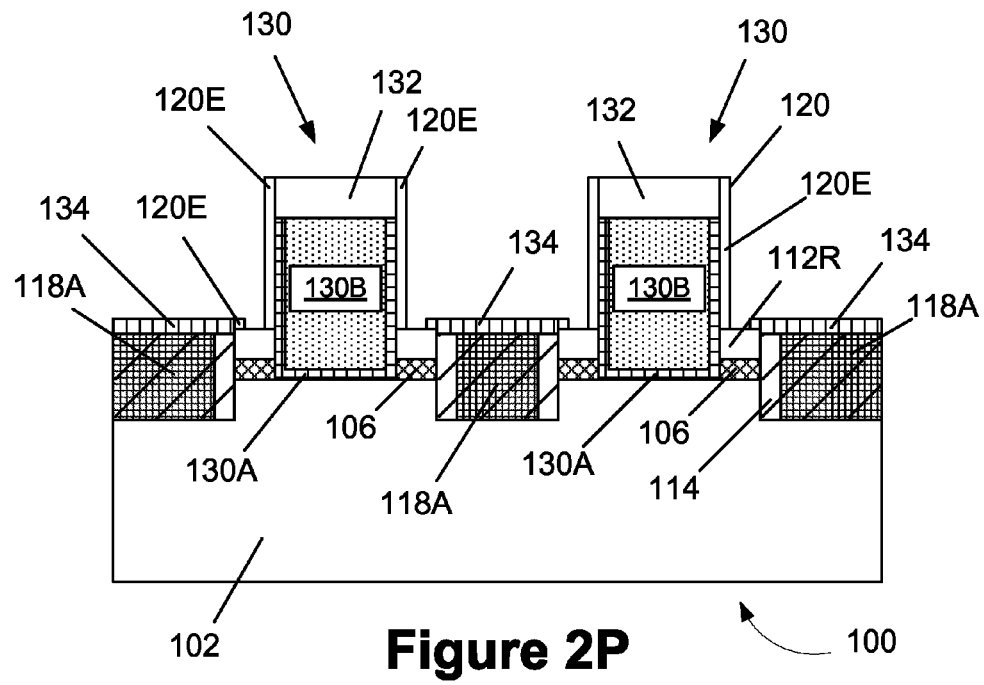

FIG. 2P depicts the device 100 after illustrative metal silicide regions 134 have been formed on the raised source/drain regions 114. In a field effect transistor, metal silicide regions are typically formed in the source/drain regions of a transistor to reduce the resistance when a conductive contact is formed to establish electrical connection to the source/drain regions. The metal silicide regions 134 depicted herein may be made using a variety of different refractory metals, e.g., nickel, platinum, cobalt, etc., or combinations thereof, and they may be formed using techniques that are well known to those skilled in the art. The typical steps performed to form metal silicide regions are: (1) depositing a layer of refractory metal on the source/drain region; (2) performing an initial heating process causing the refractory metal to react with underlying silicon-containing material; (3) performing an etching process to remove unreacted portions of the layer of refractory metal; and (4) performing an additional heating process to form the final phase of the metal silicide. The details of such silicidation processes are well known to those skilled in the art.

Figure 2Q:
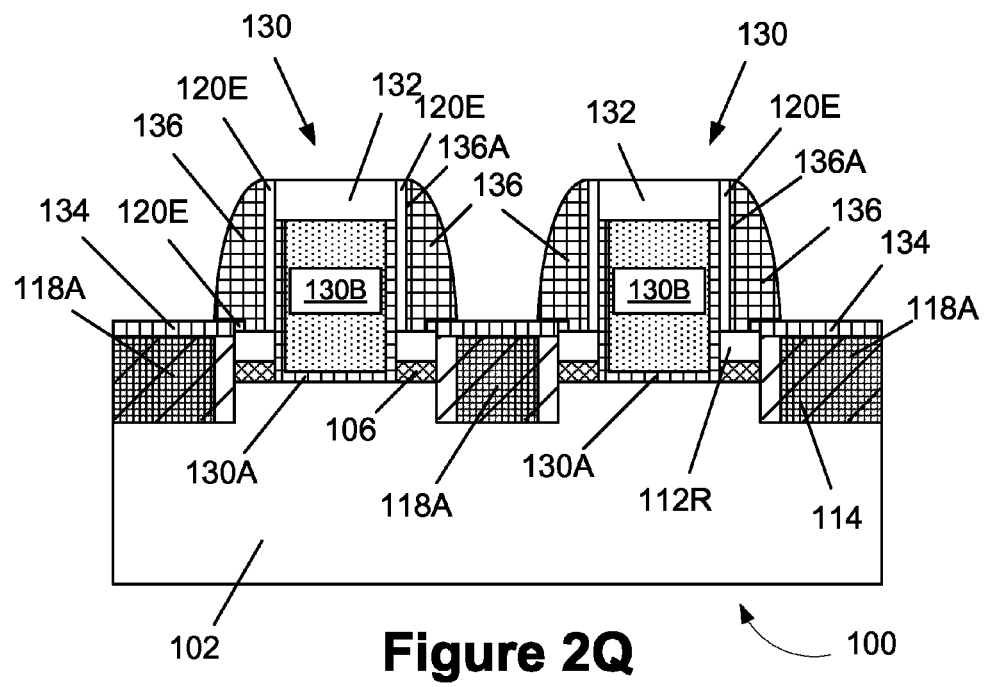

Next, as shown in FIG. 2Q, low-k sidewall spacers 136 are formed adjacent the gate structures 130 of the transistors 104A, 104B. The low-k sidewall spacers 136 may be formed by depositing a layer of spacer low-k insulating material and thereafter performing an anisotropic etching process. As used herein and in the claims, the term "low-k spacer" or "low-k material" should be understood to mean a material having a dielectric constant of less than 7. Illustrative examples of such low-k materials are silicon-carbon-nitride (SiCN), silicon-carbon-boron-nitride (SiCBN), etc. The base thickness of the low-k sidewall spacers 136 may vary depending upon the particular application. In one illustrative embodiment, the low-k sidewall spacers 136 may have a thickness at its base of about 7-15 nm. After the low-k spacer 136 is formed, all subsequent process temperatures will typically be below or equal to about 400° C. to avoid any depletion of the carbon and boron from such low-k materials. In the depicted example, the inside surface 136A of the low-k spacers 136 engages the vertically oriented portions of the etched liner layer 120E.

Figure 2R:
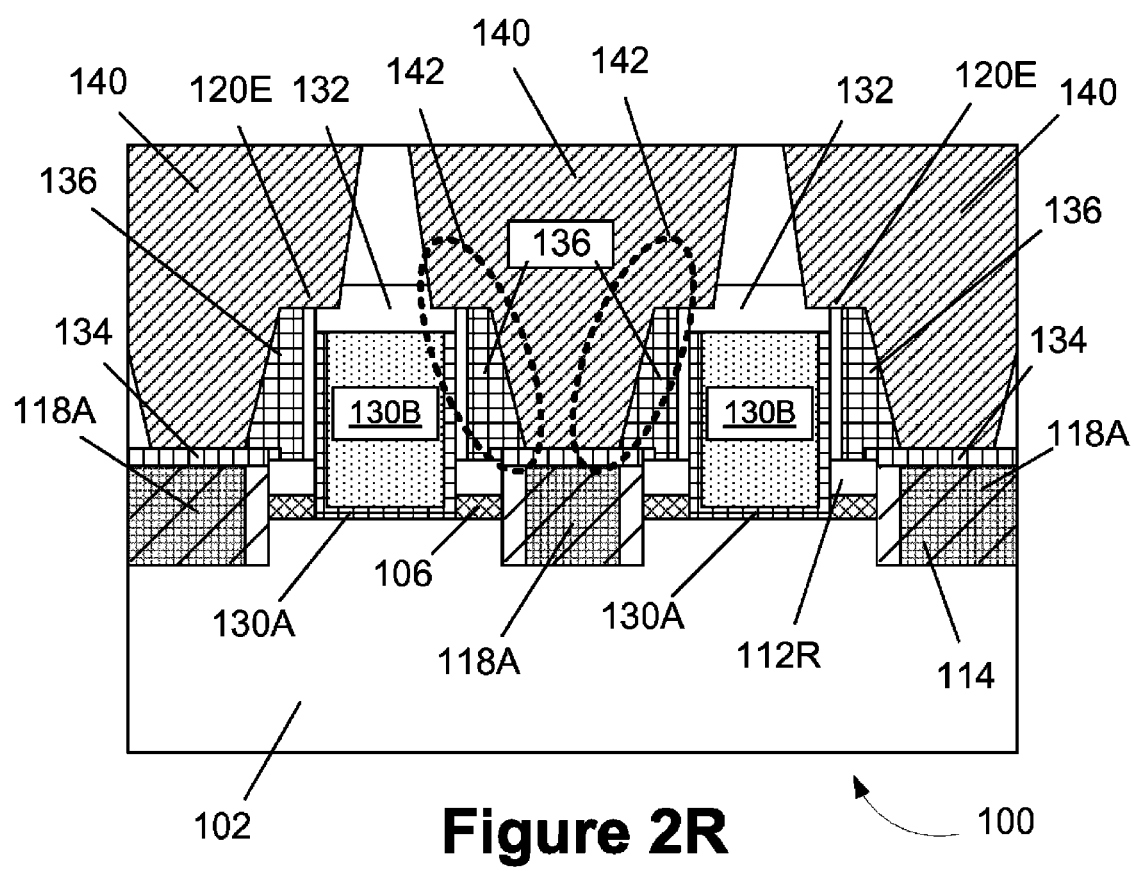

FIG. 2R depicts the device 100 after several process operations have been performed. First, a layer of insulating material, e.g., silicon dioxide, has been formed above the device 100, and a plurality of illustrative self-aligned contacts 140 have been formed to establish electrical communication with the source/drain regions 114. The manner in which such self-aligned contacts are formed are well known to those skilled in the art. The size and shape of the self-aligned contacts 140 as well as the conductive materials used to form the self-aligned contacts 140 may vary depending upon the particular device under construction. Thus, such details should not be considered to be limitations of the present disclosed inventions.

Figure 1E:
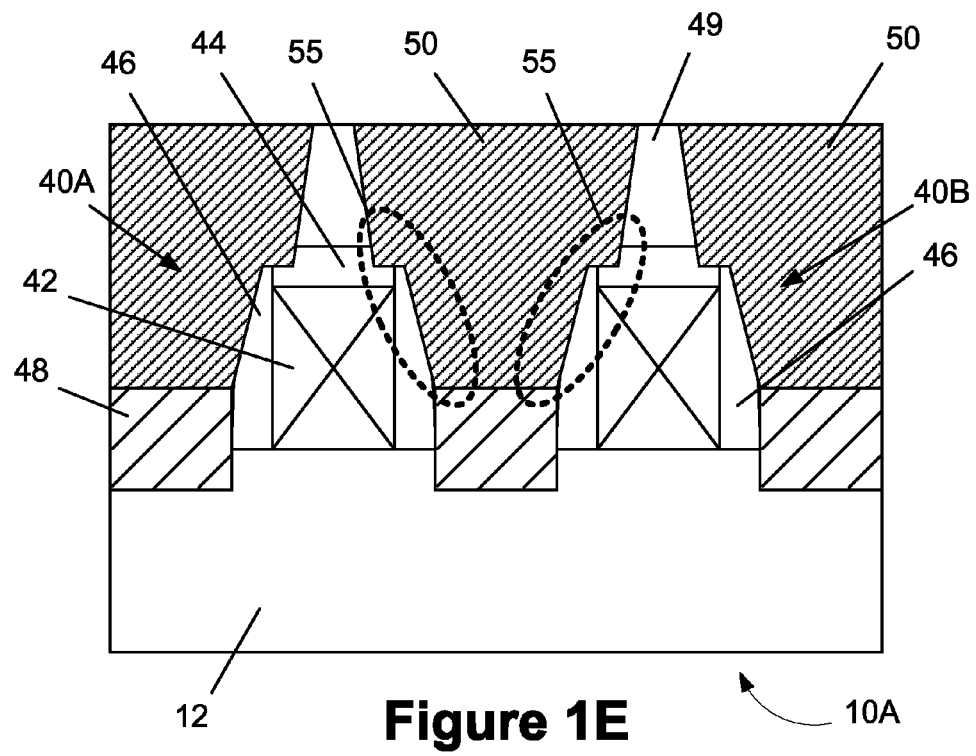

As will be appreciated by those skilled in the art after a complete reading of the present application, the methods and devices disclosed herein provide an advantage as it relates to the semiconductor devices generally described in the background section of this application. More specifically, due to the use of the low-k spacers 136 with the novel devices disclosed herein, the capacitance of the gate-to-contact capacitor in the area generally indicated by the dashed lines 142 may be less than the corresponding gate-to-contact capacitor in the prior art device 10 depicted in FIG. 1E. Accordingly, the devices disclosed herein may operate at faster switching speeds as it will take less time for the novel devices disclosed herein to charge and discharge the gate-to-contact capacitor each time the transistor is turned on-off.

At the point of fabrication depicted in FIG. 2R, traditional manufacturing operations may be performed to complete the formation of the device 100. For example, various metallization layers may be formed above the device 100 using known processing techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   a gate structure positioned above a semiconducting substrate, said gate structure comprising a gate insulation layer and a gate electrode, said gate insulation layer having two upstanding portions that are substantially vertically oriented relative to an upper surface of said substrate;
   raised source/drain regions positioned laterally adjacent to opposing sides of said gate structure;
   a first sidewall spacer positioned between said gate structure and said raised source/drain regions, wherein said first sidewall spacer is positioned on and in contact with a lower sidewall surface of each of said two upstanding portions of said gate insulation layer;
   a liner layer comprising one of silicon nitride and silicon oxynitride, wherein said liner layer comprises a first liner layer portion positioned on and in contact with an upper sidewall surface of each of said two upstanding portions of said gate insulation layer and a second liner layer portion positioned laterally adjacent a sidewall surface of each of said raised source/drain regions, each of said first and second liner layer portions having a lower surface that is in direct contact with an upper surface of said first sidewall spacer, wherein said two respective upstanding portions are positioned between and separate said first liner layer portions and respective sidewall surfaces of said gate electrode; and
   a low-k sidewall spacer positioned on said liner layer, wherein a portion of said low-k sidewall spacer is positioned between and separates said first and second liner layer portions and is in direct contact with said upper surface of said first sidewall spacer.

2. The device of claim 1, wherein said low-k sidewall spacer is comprised of a material having a k value of less than 7.

3. The device of claim 1, wherein said gate insulation layer is comprised of a high-k insulating material and said gate electrode is comprised of at least one layer of metal.

4. The device of claim 1, further comprising a self-aligned contact that contacts said low-k spacer.

5. The device of claim 1, further comprising a gate cap layer positioned above said gate insulation layer and said gate electrode, wherein said gate cap layer has first and second sidewalls and said liner layer is also positioned on and in contact with said first and second sidewalls of said gate cap layer.

6. A device, comprising:
   a gate structure positioned above a semiconducting substrate, said gate structure comprising a gate insulation layer and a gate electrode, said gate insulation layer having first and second upstanding portions;
   raised source/drain regions positioned laterally adjacent to opposing sides of said gate structure;
   a first sidewall spacer positioned between said gate structure and said raised source/drain regions, wherein said first sidewall spacer is positioned on and in contact with a lower portion of an outer sidewall surface of each of said first and second upstanding portions of said gate insulation layer;
   a gate cap layer positioned above said gate insulation layer and said gate electrode, said gate cap layer having first and second sidewalls;
   a first layer of material and a second layer of material positioned on and in contact with an upper portion of said outer sidewall surface of said first upstanding portion and said second upstanding portion, respectively, of said gate insulation layer, said first layer of material and said second layer of material each comprising a first layer portion contacting said first sidewall and said second sidewall, respectively, of said gate cap layer and a second layer portion contacting a sidewall portion of a respective one of said raised source/drain regions, wherein said first and second layer portions of said first layer of material and said second layer of material each have a lower surface that is in direct contact with an upper surface of said first sidewall spacer and wherein said first upstanding portion is positioned between and separates said first layer portion of said first layer of material and a first sidewall surface of said gate electrode and said second upstanding portion is positioned between and separates said first layer portion of said second layer of material and a second sidewall surface of said gate electrode; and first and second low-k sidewall spacers positioned on and in contact with said first and second layers of material, respectively, wherein a portion of each of said first and second low-k sidewall spacers is positioned between and separates said first and second layer portions of each of said first and second layers of material and is in direct contact with said upper surface of said first sidewall spacer.

7. The device of claim 6, wherein said first and second low-k sidewall spacers are comprised of a material having a k value of less than 7.

8. The device of claim 6, wherein said gate insulation layer is comprised of a high-k insulating material and said gate electrode is comprised of at least one layer of metal.

9. The device of claim 6, further comprising a self-aligned contact that contacts one of said first and second low-k spacers.

10. The device of claim 6, wherein said first and second layers of material are comprised of one of silicon nitride or silicon oxynitride.

11. The device of claim 6, wherein said first and second upstanding portions of said gate insulation layer are substantially vertically oriented relative to an upper surface of said substrate.

12. A device, comprising:
a gate structure positioned above a semiconducting substrate, said gate structure comprising a high-k gate insulation layer and a gate electrode comprised of at least one layer of metal, said gate insulation layer having first and second upstanding portions that are substantially vertically oriented relative to an upper surface of said substrate;
raised source/drain regions positioned laterally adjacent to opposing sides of said gate structure;
a first sidewall spacer positioned between said gate structure and said raised source/drain regions, said first sidewall spacer being positioned on and in contact with a lower portion of an outer sidewall surface of each of said first and second upstanding portions of said gate insulation layer and a sidewall of each of said raised source/drain regions;
a gate cap layer positioned above said gate insulation layer and said gate electrode;
a first layer of material and a second layer of material, each comprising a first portion positioned on and in contact with an upper portion of said outer sidewall surface of said first upstanding portion and said second upstanding portion, respectively, of said gate insulation layer and a second portion positioned on and in contact with said sidewall of a respective one of said raised source/drain regions, wherein said first upstanding portion is positioned between and separates said first portion of said first layer of material and a first sidewall surface of said gate electrode and said second upstanding portion is positioned between and separates said first portion of said second layer of material and a second sidewall surface of said gate electrode, each of said first and second portions of said first and second layers of material comprising one of silicon nitride or silicon oxynitride and having a lower surface that is in direct contact with an upper surface of said first sidewall spacer; and first and second low-k sidewall spacers positioned on and in contact with said first and second layers of material, respectively, wherein a portion of each of said first and second low-k sidewall spacers is positioned between and separates said first and second portions of each of said first and second layers of material and is in direct contact with said upper surface of said first sidewall spacer.

13. The device of claim 12, wherein said first and second low-k sidewall spacers are comprised of a material having a k value of less than 7.

14. The device of claim 13, further comprising a self-aligned contact that contacts one of said first and second low-k spacers.

15. The device of claim 6, wherein said gate cap layer is positioned on and in contact with an upper surface of each of said first and second upstanding portions of said gate insulation layer and an upper surface of said gate electrode.

16. The device of claim 12, wherein said gate cap layer is positioned on and in contact with an upper surface of each of said first and second upstanding portions of said gate insulation layer.

17. The device of claim 12, wherein said gate cap layer is positioned on and in contact with an upper surface of said gate electrode.

18. The device of claim 12, wherein said first layer of material contacts a first sidewall of said gate cap layer and said second layer of material contacts a second sidewall of said gate cap layer.

19. The device of claim 1, further comprising a gate cap layer positioned on and in contact with an upper surface of each of said two upstanding portions of said gate insulation layer and an upper surface of said gate electrode.

20. The device of claim 1, wherein said first sidewall spacer and said second liner layer portion each directly contact said sidewall surface of each of said raised source/drain regions.

21. The device of claim 6, further comprising an insulation material layer positioned between said first sidewall spacer and an active region of said device, wherein said first sidewall spacer is in direct contact with an upper surface of said insulation material layer and a second sidewall portion of each of said raised source/drain regions.

* * * * *